US007814786B2

(12) United States Patent
Woodard

(10) Patent No.: US 7,814,786 B2
(45) Date of Patent: Oct. 19, 2010

(54) WIRELESS SENSING SYSTEM FOR NON-INVASIVE MONITORING OF ATTRIBUTES OF CONTENTS IN A CONTAINER

(75) Inventor: Stanley E. Woodard, Hampton, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 222 days.

(21) Appl. No.: 12/015,626

(22) Filed: Jan. 17, 2008

(65) Prior Publication Data

US 2008/0184795 A1   Aug. 7, 2008

Related U.S. Application Data

(60) Provisional application No. 60/885,282, filed on Jan. 17, 2007.

(51) Int. Cl.
*G01F 23/00* (2006.01)
*G01F 23/26* (2006.01)
*G01N 11/00* (2006.01)
(52) U.S. Cl. .................... 73/291; 73/304 C; 73/53.01
(58) Field of Classification Search ............... 73/304 C, 73/304 R, 290 R, 291, 53.01
See application file for complete search history.

(56) References Cited

U.S. PATENT DOCUMENTS

| 3,219,942 A | 11/1965 | Bell |
| 3,412,359 A | 11/1968 | Schwyn et al. |
| 4,220,920 A | 9/1980 | Gross |
| 4,513,617 A * | 4/1985 | Hayes .......................... 73/313 |
| 4,820,990 A | 4/1989 | Moore |
| 4,825,168 A | 4/1989 | Ogawa et al. |
| 4,862,088 A | 8/1989 | Etienne et al. |
| 4,904,878 A | 2/1990 | Gipp et al. |
| 5,077,525 A | 12/1991 | West et al. |

(Continued)

FOREIGN PATENT DOCUMENTS

EP          112783 A2     7/1984

OTHER PUBLICATIONS

U.S. Appl. No. 11/856,807, filed Sep. 18, 2007, Stanley E. Woodard, et al.

(Continued)

*Primary Examiner*—Hezron Williams
*Assistant Examiner*—Nathaniel Kolb
(74) *Attorney, Agent, or Firm*—Robin W. Edwards

(57) ABSTRACT

A wireless sensing system monitors the level, temperature, magnetic permeability and electrical dielectric constant of a non-gaseous material in a container. An open-circuit electrical conductor is shaped to form a two-dimensional geometric pattern that can store and transfer electrical and magnetic energy. The conductor resonates in the presence of a time-varying magnetic field to generate a harmonic response. The conductor is mounted in an environmentally-sealed housing. A magnetic field response recorder wirelessly transmits the time-varying magnetic field to power the conductor, and wirelessly detects the harmonic response that is an indication of at least one of level of the material in the container, temperature of the material in the container, magnetic permeability of the material in the container, and dielectric constant of the material in the container.

23 Claims, 10 Drawing Sheets

U.S. PATENT DOCUMENTS

| | | |
|---|---|---|
| 5,818,241 A | 10/1998 | Kelly |
| 6,089,751 A | 7/2000 | Conover et al. |
| 6,293,142 B1 | 9/2001 | Pchelnikov et al. |
| 7,086,593 B2 | 8/2006 | Woodard et al. |
| 7,128,875 B2 | 10/2006 | Cubicciotti |
| 7,159,774 B2 | 1/2007 | Woodard et al. |
| 7,161,165 B2 | 1/2007 | Wirthlin |
| 7,255,004 B2 | 8/2007 | Taylor et al. |
| 2003/0082859 A1 | 5/2003 | Ichijo et al. |
| 2004/0142603 A1 | 7/2004 | Walker |
| 2005/0007239 A1* | 1/2005 | Woodard et al. ........... 340/10.2 |
| 2005/0024180 A1 | 2/2005 | Handa |
| 2005/0122305 A1 | 6/2005 | Murao et al. |
| 2005/0149169 A1 | 7/2005 | Wang et al. |
| 2005/0156604 A1 | 7/2005 | Red'ko et al. |
| 2005/0164055 A1 | 7/2005 | Hasegawa et al. |
| 2006/0053880 A1 | 3/2006 | Taylor et al. |
| 2006/0104330 A1 | 5/2006 | Ho Limb et al. |
| 2006/0191887 A1 | 8/2006 | Baer et al. |
| 2007/0000321 A1* | 1/2007 | Boudaoud et al. ......... 73/304 R |
| 2007/0113642 A1 | 5/2007 | Bonne et al. |
| 2007/0157718 A1 | 7/2007 | Woodard et al. |
| 2007/0181683 A1 | 8/2007 | Woodard et al. |
| 2007/0183110 A1 | 8/2007 | Woodard et al. |

OTHER PUBLICATIONS

U.S. Appl. No. 11/864,012, filed Sep. 28, 2007, Stanley E. Woodard, et al.

U.S. Appl. No. 11/930,222, filed Oct. 31, 2007, Stanley E. Woodard, et al.

* cited by examiner

US 7,814,786 B2

WIRELESS SENSING SYSTEM FOR NON-INVASIVE MONITORING OF ATTRIBUTES OF CONTENTS IN A CONTAINER

Pursuant to 35 U.S.C. §119, the benefit of priority from provisional application 60/885,282, with a filing date of Jan. 17, 2007, is claimed for this non-provisional application.

ORIGIN OF THE INVENTION

This invention was made by an employee of the United States Government and may be manufactured and used by or for the Government of the United States of America for governmental purposes without the payment of any royalties thereon or therefore.

BACKGROUND OF THE INVENTION

1. Field of the Invention

This invention relates to wireless sensing systems. More specifically, the invention is a wireless sensing system for non-invasive monitoring of attributes of a non-gaseous material in an electrically non-conductive container (e.g., level, temperature, change to contents' magnetic permeability, dielectric constant and other measurable property attributes. A further embodiment of the present invention monitors the attributes of a non-gaseous material in an electrically conductive container.

2. Description of the Related Art

Fluid level and/or other attributes (e.g., temperature, magnetic permeability, dielectric constant) of a fluid in a container are typically monitored by a device positioned or installed in the container. For example, a container's fluid level could be monitored manually using a conventional dipstick that is inserted into the container and then removed with the fluid level being indicated on the dipstick. A variety of "in container" fluid level measurement systems using floats, capacitive probes and fiber optics are also well known in the art.

More recently, a wireless fluid level measuring system was disclosed in U.S. Pat. No. 7,255,004. Briefly, this system includes a level-sensing probe positioned in a tank. The probe is divided into sections, with each section including (i) a fluid-level capacitive sensor disposed along the length thereof, (ii) an inductor electrically coupled to the capacitive sensor, (iii) an external antenna positioned for inductive coupling to the inductor, and (iv) an electrical conductor coupled to the external antenna. An electrically non-conductive housing accessible from a position outside of the tank houses inductors arrayed in a pattern. A magnetic field response recorder has a measurement head with transceiving antennas arrayed therein to correspond to the pattern of the housing's inductors. When a measurement is to be taken, the measurement head is mechanically coupled to the housing so that each housing inductor is substantially aligned with a specific one of the transceiving antennas.

While the various manual and automatic fluid level measurement systems generally perform well, it is not always possible or prudent to position/install a fluid level measurement or other fluid attribute monitoring system in a container.

SUMMARY OF THE INVENTION

Accordingly, it is an object of the present invention to provide a wireless system that can non-invasively monitor one or more attributes of the contents of a container.

Another object of the present invention is to provide a system that can monitor the contents of a container from a position that is outside of the container.

Still another object of the present invention is to provide a system that can monitor the contents of an electrically conductive container.

Other objects and advantages of the present invention will become more obvious hereinafter in the specification and drawings.

In accordance with the present invention, a wireless sensing system is provided for monitoring one or more of the level, temperature, magnetic permeability and electrical dielectric constant of a non-gaseous material in an electrically non-conductive container. The magnetic permeability and the dielectric constant of the material in the container can be correlated to the physical state of the material. An environmentally-sealed housing that is electrically non-conductive is positioned adjacent to the container that stores the non-gaseous material. The housing spans a selected height of the container. An electrical conductor having first and second ends is shaped to form a two-dimensional geometric pattern between its first and second ends. The conductor in the geometric pattern defines an open-circuit that can store and transfer electrical and magnetic energy. The conductor resonates in the presence of a time-varying magnetic field to generate a harmonic response. The conductor is mounted in the housing such that the geometric pattern substantially spans the selected height of the container. A magnetic field response recorder wirelessly transmits the time-varying magnetic field to power the conductor. The magnetic field response recorder also wirelessly detects the harmonic response that is an indication of at least one of level of the material in the container, temperature of the material in the container, magnetic permeability of the material in the container, and dielectric constant of the material in the container. In a further embodiment of the present invention, a sensing system is provided for monitoring one or more attributes of a non-gaseous material in an electrically conductive container.

DETAILED DESCRIPTION OF THE INVENTION

Figure 1A:
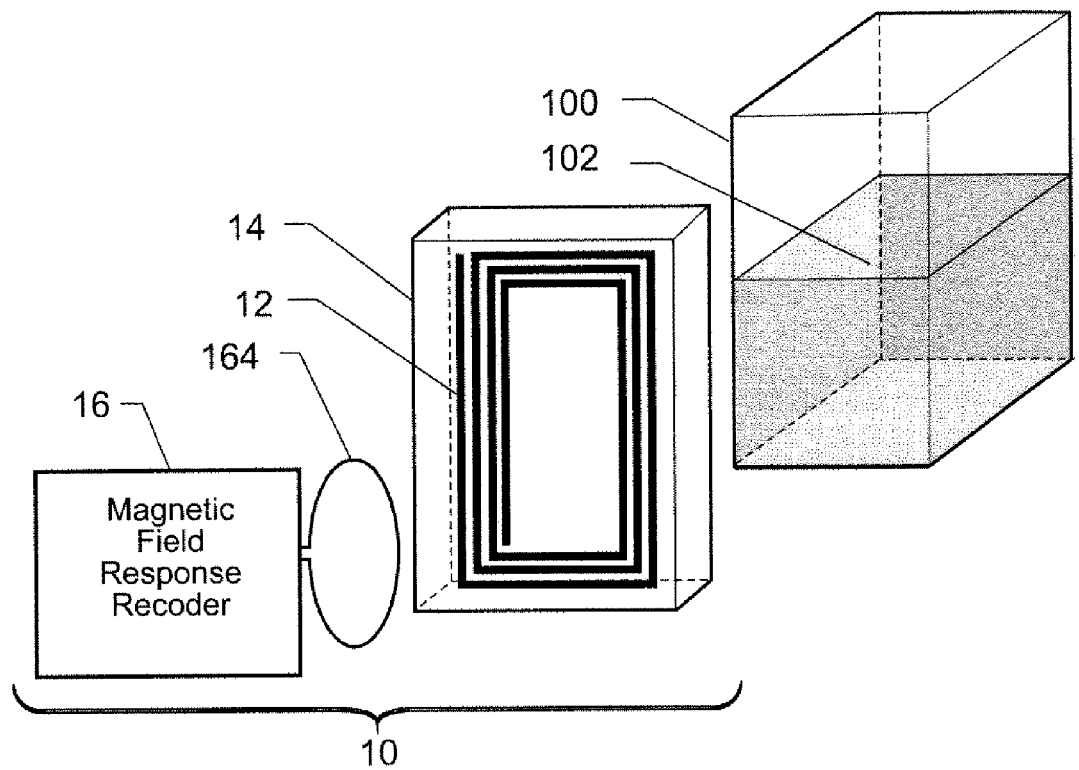
FIGS. 1a and 1b are an isometric view and a schematic view, respectively, of a wireless and non-invasive sensing system that can be used to monitor various attributes of the contents of a container in accordance with an embodiment of the present invention.

Referring now to the drawings and more particularly to FIG. 1, a wireless and non-invasive sensing system for monitoring a variety of attributes of a container's contents in accordance with an embodiment of the present invention is shown and is referenced generally by numeral 10. The container is referenced by numeral 100 and the contents thereof are referenced by numeral 102. For purpose of one embodiment of the present invention, container 100 is constructed from electrically non-conductive materials). Contents 102 in container 100 can be any non-gaseous material or substance (e.g., solid material, fluid, fluid-like substance such as a granular or powdered material, or an amorphous material such as a sludge or slurry, etc.) that possesses magnetic permeability and/or electric dielectric properties.

Sensing system 10 includes a sensor 12 sealed within a housing or encasement 14 that protects sensor 12 from the outside environment and a means to inductively power and interrogate sensors, such as a magnetic field response recorder 16. Magnetic field response recorder includes an antenna 164 for powering and interrogating sensors. Housing 14 is any electrically non-conductive sealed or sealable housing or package that can maintain sensor 12 in its geometric configuration (to be described further below) when housing 14 is positioned adjacent to container 100 such that sensor 12 spans a selected vertical portion of container 100. The selected vertical portion is dependent on the function of sensing system 10. For example, when sensing system 10 is to be used to monitor the level of contents 102 in container 100, sensor 12 should be configured to span the portion of container 100 that can be filled with contents 102. Housing 14 can be a rigid housing designed to stand on its own alongside container 100. However, housing 14 could also be a flexible package designed to be mounted on or adhered to the side of container 100. When the measurement system 10 is used with a container having contents 102 that produce combustible, corrosive or caustic vapors, a vapor barrier 214 or electrically non-conductive bulkhead can be placed between the recorder 16 and the sensor 12 and the container 100 as a means of isolating the vapors from the electrical components in magnetic field response recorder, The encasement 14 of the sensor 12 prevents the sensor from being exposed to the vapors. Accordingly, it is to be understood that housing 14 can be realized in a variety of ways without departing from the scope of the present invention.

Figure 2:
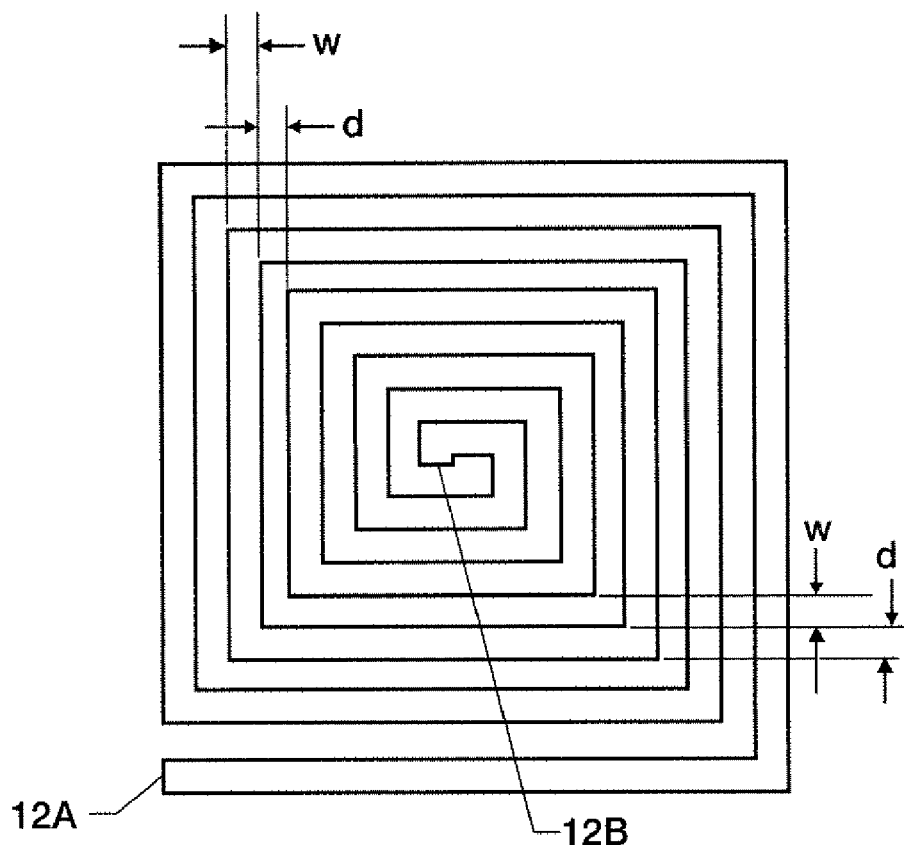
FIG. 2 is an isolated plan view of a spiral trace sensor in accordance with an embodiment of the present invention.

By way of example, sensor 12 comprises an open-circuit spiral trace as shown in an isolated plan view in FIG. 2. However, it is to be understood that an open-circuit sensor In the present invention can be any electrically-conductive, twos dimensional geometric pattern that can store and transfer electrical and magnetic energy. For the illustrated sensor 12, the trace width W and spacing d between adjacent trace runs have been exaggerated for purpose of illustration. Details of sensor 12 are disclosed in co-pending U.S. patent application Ser. No. 11/671,089, filed Feb. 5, 2007, the contents of which are hereby incorporated by reference and are repeated herein to provide a complete description of the present invention.

Spiral trace sensor 12 is made from an electrically-conductive run or trace that can be deposited onto a substrate or other surface (not shown) prior to being sealed in housing 14. Sensor 12 could also be deposited onto a substrate material that is part of housing 14. The particular choice of the mounting of sensor 12 in housing 14, choice of substrate material(s) and/or choice of substrate construction (if used) will vary depending on the application.

Sensor 12 is a spiral winding of conductive material with its ends 12A and 12B remaining open or unconnected. Accordingly, sensor 12 is said to be an open-circuit. Techniques used to deposit sensor 12 either directly onto a surface or on/in a substrate material can be any conventional metal-conductor deposition process to include thin-film fabrication techniques. In the illustrated embodiment, sensor 12 is constructed to have a uniform trace width throughout (i.e., trace width W is constant) with uniform spacing (i.e., spacing d is constant) between adjacent portions of the spiral trace. However, as will be explained further below, the present invention is not limited to a uniform width conductor spirally wound with uniform spacing.

As is well known and accepted in the art, a spiral inductor is ideally constructed/configured to minimize parasitic capacitance so as not to influence other electrical components that will be electrically coupled thereto. This is typically achieved by increasing the spacing between adjacent conductive portions or runs of the conductive spiral trace. However, in the present invention, sensor 12 is constructed/configured to have a relatively large parasitic capacitance. The capacitance of sensor 12 is operatively coupled with the sensor's inductance such that magnetic and electrical energy can be stored and exchanged between the sensor's magnetic field and electric field. Since other geometric patterns of a conductor could also provide such a magnetic/electrical energy storage and exchange, it is to be understood that the present invention could be realized using any such geometrically-patterned conductor and is not limited to a spiral-shaped sensor.

The amount of inductance along any portion of a conductive run of sensor 12 is directly related to the length thereof and inversely related to the width thereof. The amount of capacitance between portions of adjacent conductive runs of sensor 12 is directly related to the length by which the runs overlap each other and is inversely related to the spacing between the adjacent conductive runs. The amount of resistance along any portion of a conductive run of sensor 12 is directly related to the length and inversely related to the width of the portion. Total capacitance, total inductance and total resistance for spiral trace sensor 12 are determined simply by adding these values from the individual portions of sensor 12. The geometries of the various portions of the conductive runs of the sensor can be used to define the sensor's resonant frequency.

Spiral trace sensor 12 with its inductance operatively coupled to its capacitance defines a magnetic field response sensor. In the presence of a time-varying magnetic field, sensor 12 electrically oscillates at a resonant frequency that is dependent upon the capacitance, inductance and resistance of sensor 12. This oscillation occurs as the energy is harmonically transferred between the inductive portion of sensor 12

(as magnetic energy) and the capacitive portion of sensor 12 (as electrical energy). In order to be readily detectable, the capacitance, inductance and resistance of sensor 12 and the energy applied to sensor 12 from the external oscillating magnetic field should be such that the amplitude of the sensor's harmonic response is at least 10 dB greater than any ambient noise where such harmonic response Ls being measured.

Figure 1B:
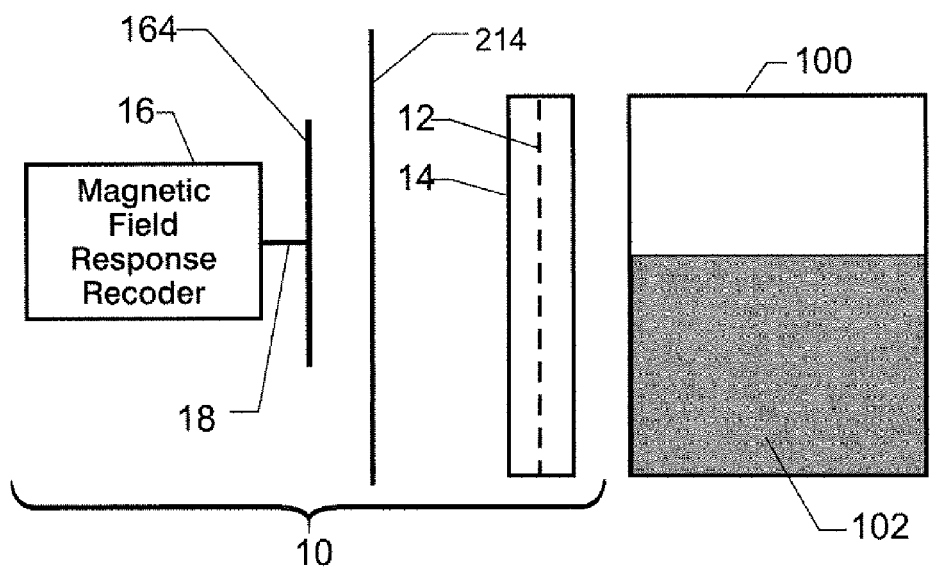
Figure 3:
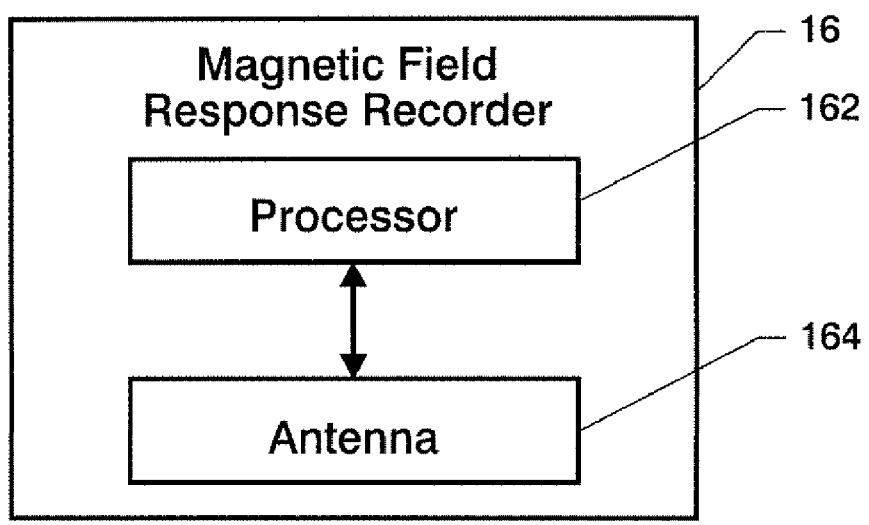
FIG. 3 is a schematic view of an embodiment of a magnetic field response recorder that can be used to interrogate the sensor in the present invention.

The application of a time-varying magnetic field to sensor 12 as well as the reading of the induced harmonic response at a resonant frequency is accomplished by a magnetic field response recorder 16 that is illustrated schematically in FIG. 3. The operating principles and construction details of recorder 16 are provided in U.S. Pat. Nos. 7,086,593 and 7,159,774, the contents of which are hereby incorporated by reference. Briefly, magnetic field response recorder 16 includes a processor 162 and a broadband radio frequency (RF) antenna 164 capable of transmitting and receiving RF energy. Processor 162 includes algorithms embodied in software for controlling antenna 164 and for analyzing the RF signals received from sensor 12. On the transmission side, processor 162 modulates an input signal that is then supplied to antenna 164 so that antenna 164 produces either a broadband time-varying magnetic field or a single harmonic field. On the reception side, antenna 164 receives harmonic magnetic responses produced by sensor 12. Antenna 164 can be realized by two separate antennas or a single transceiving antenna (as shown) that is switched between transmission and reception. Antenna 164 can be internal to the magnetic field response recorder 16 or coupled to processor 162 via an external connector 18 as shown in FIG. 1b. For an operational scenario where sensor 12 is to be read by a user, recorder 16 can be handheld, mounted on a robot, or mounted to a piece of handling equipment (e.g., conveyor, lift, shelf, etc.) without departing from the scope of the present invention.

Figure 4:
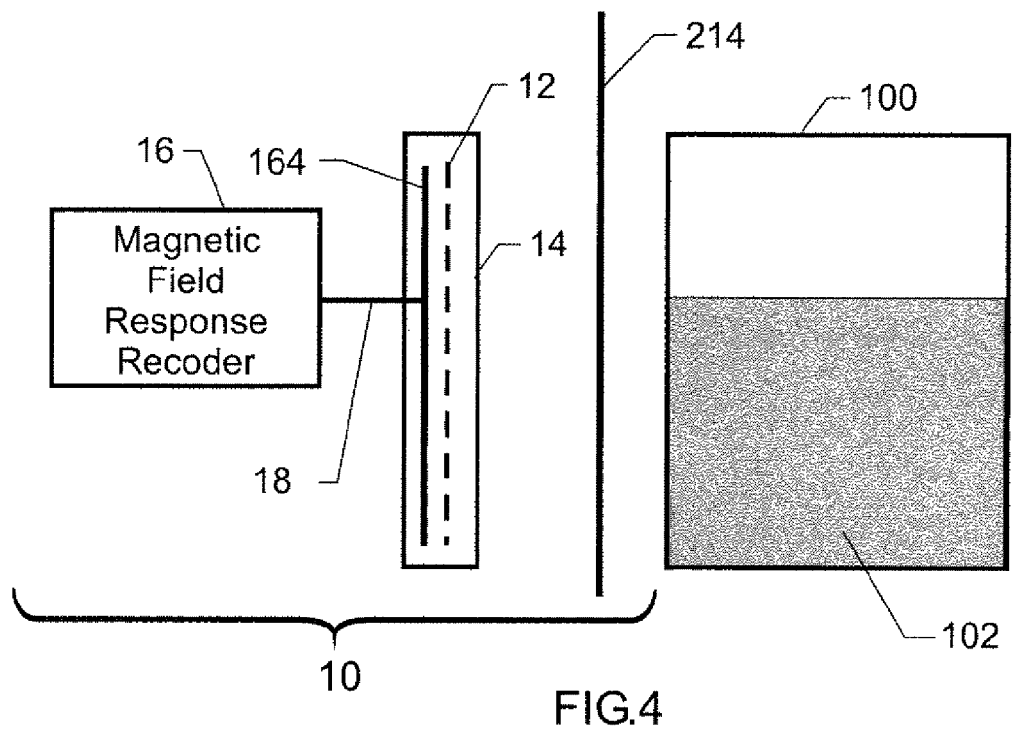
FIG. 4 is a schematic view of a wireless and non-invasive sensing system in accordance with another embodiment of the present invention.

The antenna portion (e.g., antenna 164) of magnetic field response recorder 16 could also be placed in housing 14 in a spaced apart relationship with sensor 12 as illustrated in FIG. 4. However, this will necessitate a hard wire connection 18 between antenna 164 and the processor portion of recorder 16. When the measurement system 10 is used with a container having contents 102 that produce combustible, corrosive or caustic vapors, a vapor barrier or electrically non-conductive bulkhead 214 can be placed between the recorder 16 and antenna 164 and the sensor 12 and the container 100 as a means of isolating the vapors from the electrical components in magnetic field response recorder 16 and antenna assembly 164, The encasement 14 of the sensor 12 prevents the sensor from being exposed to the vapors.

Figure 5:
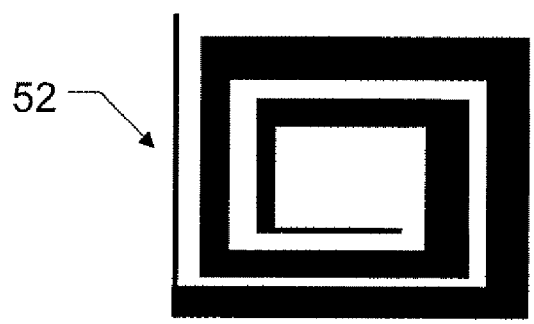
FIG. 5 is a schematic view of a spiral trace sensor whose traces are non-uniform in width.
Figure 6:
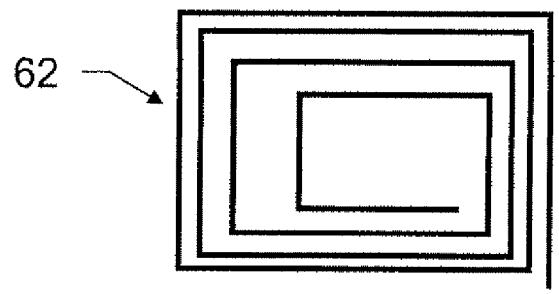
FIG. 6 is a schematic view of a spiral trace sensor having non-uniform spacing between the traces thereof.
Figure 7:
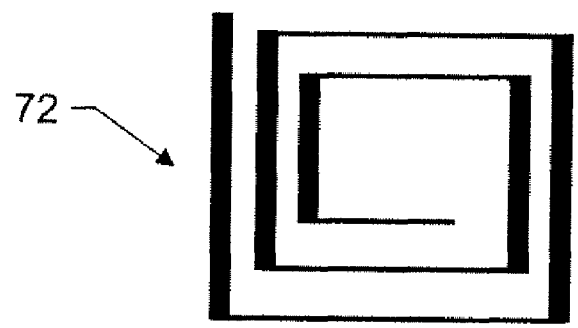
FIG. 7 is a schematic view of a spiral trace sensor having non-uniform trace width and non-uniform trace spacing.

As mentioned above, both the width of the sensor's conductive trace and the spacing between adjacent portions of the conductive trace can be uniform as shown in FIG. 2. However, the present invention is not so limited as will be shown by the following three examples. FIG. 5 illustrates a sensor 52 in which the width of the conductive trace is non-uniform while the spacing between adjacent portions of the conductive trace is uniform. FIG. 6 illustrates a sensor 62 in which the width of the conductive trace is uniform, but the spacing between adjacent portions of the conductive trace is non-uniform. Finally, FIG. 7 illustrates a sensor 72 having both a non-uniform width conductive trace and non-uniform spacing between adjacent portions of the conductive trace.

As described above, the length/width of the conductive trace and the spacing between adjacent portions of the conductive trace determine the capacitance, inductance and resistance (and, therefore, the resonant frequency) of a spiral trace sensor in the present invention. In addition, the sensor's resonant frequency can be modified by providing a dielectric material (i) that resides between adjacent portions of the sensor's conductive trace, or (ii) that encases the sensor's conductive trace (e.g., when housing 14 is formed/molded about sensor 12). In a similar manner, other electrically conductive geometric patterns that can store both electric and magnetic energy can be tailored geometrically to prescribe a desired frequency.

Figure 8:
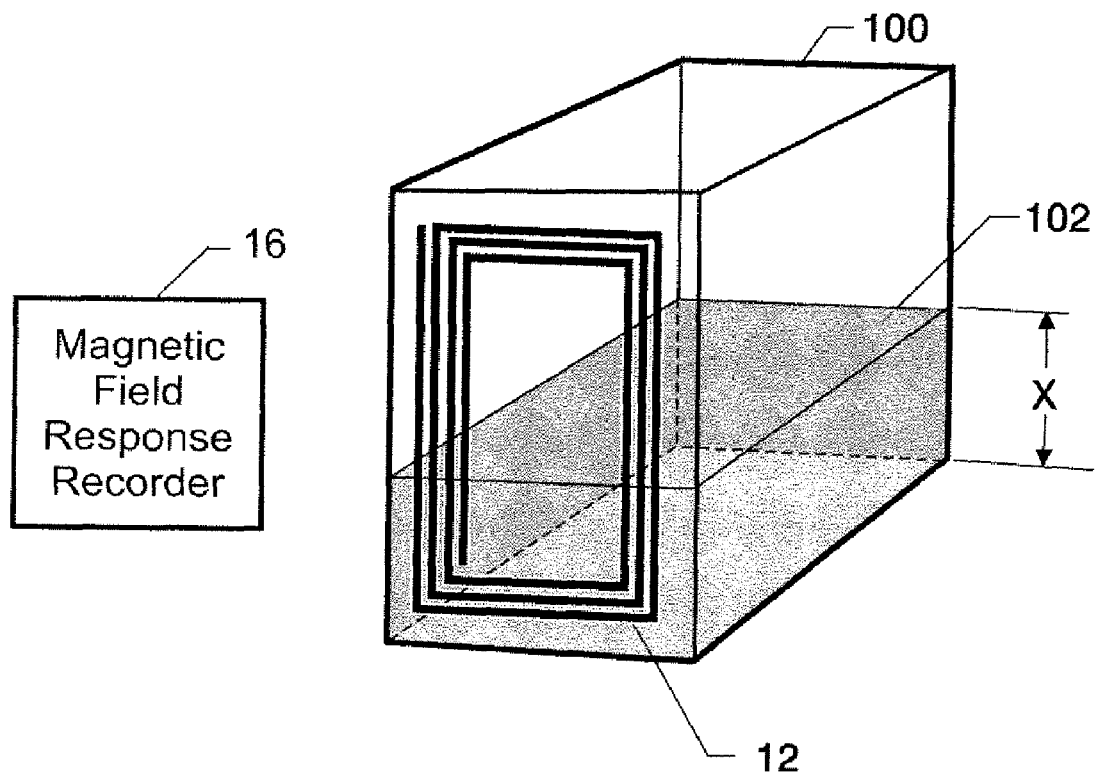
FIG. 8 is a schematic view of a wireless sensing system of the present invention positioned adjacent to a container filled with contents that are to be monitored in accordance with the present invention.
Figure 9:
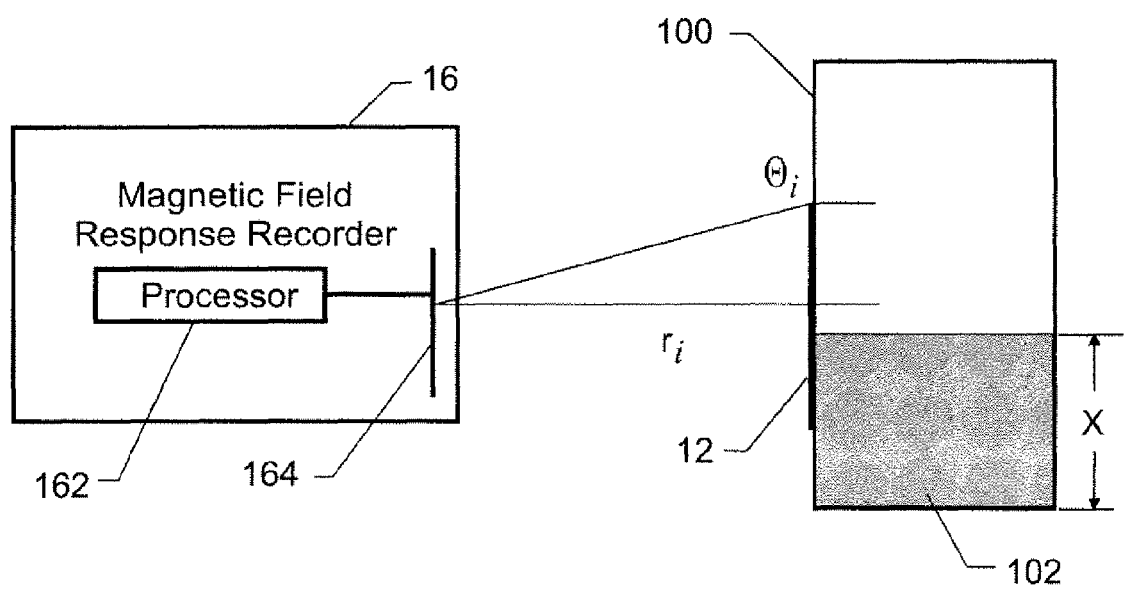
FIG. 9 is a side schematic view of the setup in FIG. 8 illustrating geometric parameters used when processing data recorded by the system of the present invention.

Sensing system 10 of the present invention can be used to non-invasively monitor a variety of attributes of contents 102. As will be described below, these attributes include the temperature of contents 102, the level of contents 102 in container 100, dielectric changes experienced by contents 102, and (magnetic) permeability changes experienced by contents 102. The value of the magnetic permeability and the dielectric constant of the material in the container can be correlated to the physical state of the material. The manner in which sensing system 10 monitors these attributes will now be explained with simultaneous reference to FIGS. 8-10, where a typical system set-up is shown in FIG. 8 with key geometric parameters being annotated in FIGS. 9 and 10. For clarity of illustration, housing 14 is not illustrated in FIGS. 8-10.

Figure 10:
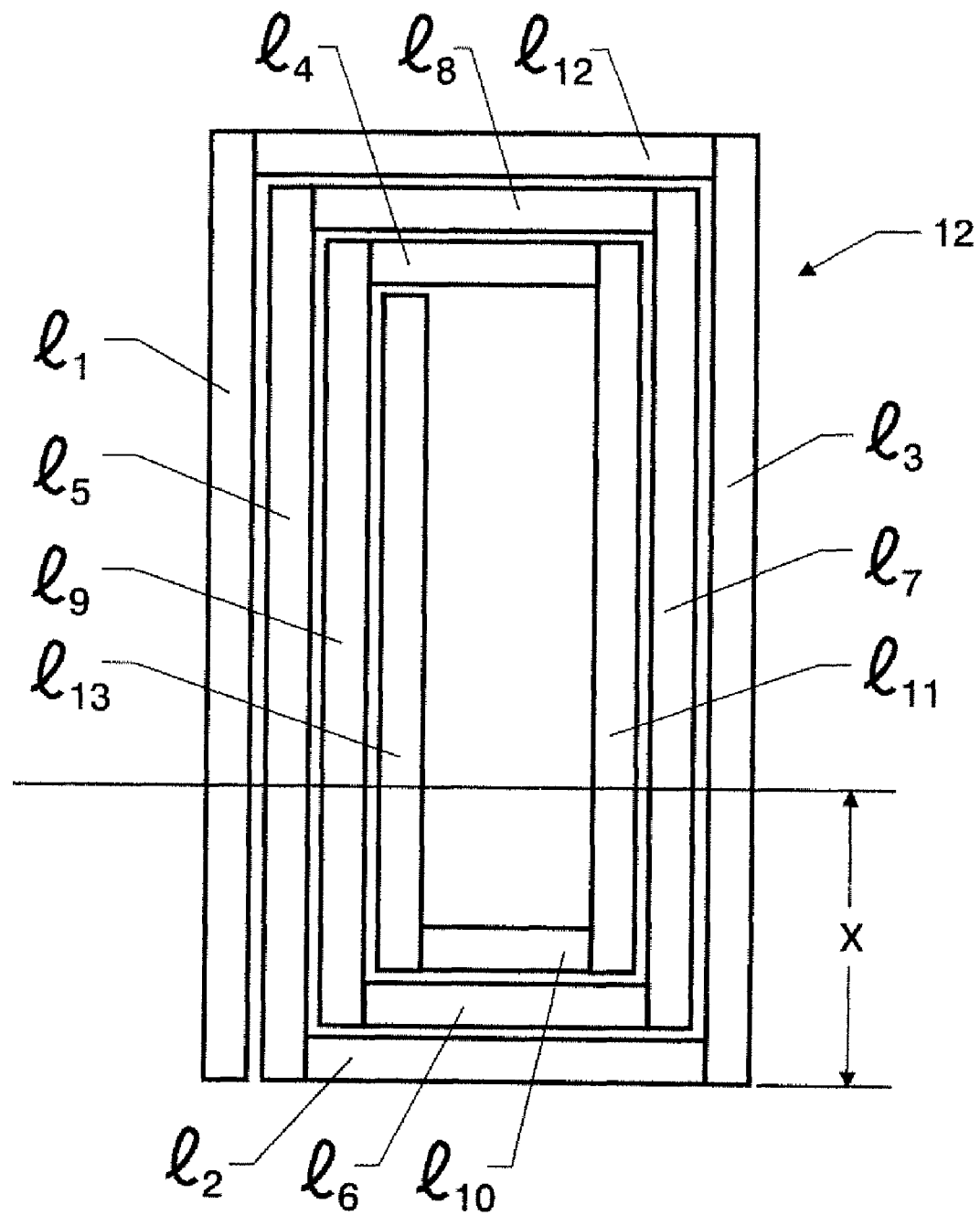
FIG. 10 is a plan view of a spiral trace sensor illustrating the sensor's straight-length portions.

For simplicity of discussion, sensor 12 consists of a single, electrically-conductive spiral trace. The trace has inherent inductance, capacitance and resistance. Sensor 12 is essentially a series of portions, with each portion having a length $\ell_i$ as shown in FIG. 10. The responding magnetic field $B_{RX}(R)$ of the geometric-patterned sensor 12 at any point in space is due to the combined response of each element $d\ell_i$ along all the sensor portions $\ell_{ij}$. Each element $d\ell_i$ is at a distance r from a point on receiving antenna 164. The interrogated response is the result of the response of all $d\ell_i$s creating a magnetic flux acting upon the receiving antenna.

The inductance and resistance are the sum of the inductance and resistance, respectively, of all sensor portions. The capacitance is the sum of the combined capacitance in the spacing between the traces. Therefore, for n sensor portions, when a sensor is electrically excited via Faraday induction, the magnetic field response produced by the sensor trace at any point in space is $$B_{RX}(R) = \left[\frac{\mu}{4\pi}\right]\left[\frac{\frac{d\Phi_{B_{TX}}}{dt}\Big|_{t_0}}{\sqrt{S^2+R^2}}\right]\sum_{i=1}^{n}\int_{\ell_i}\frac{d\ell_i\sin\theta_i}{r_i^2} \quad (1)$$

with $$L = \sum_{i=1}^{n} L_i, \quad (2)$$

$$R = \sum_{i=1}^{n} R_i, \quad (3)$$

$$C = \sum_{i=1}^{n-4} C_i, \quad (4)$$

and $$S = \left(\omega L - \frac{1}{\omega C}\right). \quad (5)$$

The sensor response at any point in space is the summation of response of each element $d\ell_i$ at a distance $r_i$ from the element, The angle, $\theta_i$, is formed by the line from the element to the point in space and the direction of the current flowing through $d l_i$. The magnetic flux, $\Phi_{B_{TX}}$, from the external transmitting antenna acting on the sensor is $$\Phi_{B_{TX}} = \int B_{TX} \cdot dS \qquad (6)$$

$B_{TX}$ is a vector whose direction and magnitude are those of the magnetic field from the transmitting antenna. S is a surface vector whose direction is that of the sensor surface normal and whose magnitude is the area of the sensor surface.

In accordance with Faraday's law on induction, the induced electromotive force c on the sensor is $$\varepsilon = \frac{d \Phi_{B_{TX}}}{dt}. \qquad (7)$$

The sensor's resistance, R, is dependent upon temperature, T, and can be referenced to a baseline minimum temperature, $T_{min}$, by the following relationship $$R = [R_{min} 1 + \alpha(T_{min} - T)] \qquad (8)$$

where $R_{min}$ is the sensor minimum resistance at $T_{min}$, and $$\alpha = \frac{1}{(234.5 + T_{min})}. \qquad (9)$$

Any temperature can be used for $T_{min}$. For example, if the minimum resistance, $R_{min}$, occurs at $T_{min} = 0°$ C., then $\alpha = 0.00427$.

The sensor response, $B_{RX}(T)$, is dependent upon temperature for fixed capacitance and inductance by the following relation $$B_{RX}(R) = \left[\frac{\mu}{4\pi}\right] \left[\frac{\frac{d\Phi_{B_{TX}}}{dt}\bigg|_{i_0}}{\sqrt{S^2 + [R_{min}[1 + \alpha(T_{min} - T)]]^2}}\right] \sum_{i=1}^{n} \int_{l_i} \frac{d l_i \sin \theta_i}{r_i^2}. \qquad (10)$$

$B_{RX}(T)$ is dependent on temperature, inductance, capacitance, and resistance at a reference temperature in degrees Celsius. Using this relationship, one can readily see that the bandwidth increases monotonically with temperature. The total sensor response received by the receiving antenna would be the summation of the response for each point on the antenna.

Once the resonant frequency and its respective amplitude for a particular sensor 12 have been identified, the response amplitude produced using the harmonic at a prescribed number prior to that producing the maximum response is then acquired. The resistance is inversely proportional to the difference of the amplitudes. The justification for such a technique is presented below.

The bandwidth of the response is proportional to the circuit resistance. However, to measure bandwidth one would need to identify the response peak and then measure the response curve on either side of the peak to ascertain the 3 dB reductions in amplitude. To identify the 3 dB reduction would require measuring all amplitudes for each discrete harmonic until the reduction amplitudes are identified. The present invention presents a simplified method to identify resistance by examining how much the amplitude is reduced from the maximum at a fixed frequency separation, $\Delta\omega$, from the resonant frequency, $\omega_r$, where $$\omega^* = \omega_r - \Delta\omega \qquad (11)$$

The response at the $\omega^*$ is $$B_{RX}(T, \omega^*) = \left[\frac{\mu}{4\pi}\right] \left[\frac{\frac{d\Phi_{B_{TX}}}{dt}\bigg|_{i_0}}{\sqrt{\left(\omega^* L - \frac{1}{\omega^* C}\right)^2 + [R_{min}[1 + \alpha(T_{min} - T)]]^2}}\right] \qquad (12)$$

$$\sum_{i=1}^{n} \int_{l_i} \frac{d l_i \sin \theta_i}{r_i^2}$$

The amplitude difference is $$B_{RX}(T, \omega_r) - B_{RX}(T, \omega^*) = \left[\frac{\mu \frac{d\Phi_{B_{TX}}}{dt}\bigg|_{i_0}}{4\pi}\right] \left[\frac{1}{[R_{min}[1 + \alpha(T_{min} - T)]]^2} - \right. \qquad (13)$$

$$\left. \frac{1}{\sqrt{\left(\omega^* L - \frac{1}{\omega^* C}\right)^2 + [R_{min}[1 + \alpha(T_{min} - T)]]^2}}\right]$$

$$\sum_{i=1}^{n} \int_{l_i} \frac{d l_i \sin \theta_r}{r_i^2}$$

where $$S^* = \omega^* L - \frac{1}{\omega^* C}. \qquad (14)$$

Because $$\sqrt{S^{*2} + [R_{min}[1 + \alpha(T_{min} - T)]]^2} > R_{min}[1 + \alpha(T_{min} - T)] \qquad (15)$$

and $$\frac{1}{R_{min}[1 + \alpha(T_{min} - T)]} > \frac{1}{S^{*2} + [R_{min}[1 + \alpha(T_{min} - T)]]^2} \qquad (16)$$

the above expression is monotonic with respect to T for fixed $S^*$. Therefore, $$R(T) = f(B_{RX}(T, \omega_r) - B_{RX}(T, \omega^*)) \qquad (17)$$

Normalized to the maximum response amplitude, $B_{RX \, max}$, $R(T)$ is $$R(T) = f\left(\frac{B_{RX}(T, \omega_r) - B_{RX}(T, \omega^*)}{B_{RX max}(T, \omega_{rmax})}\right). \qquad (18)$$

The resonant that produces $B_{RX max}$ is $\omega_{r \, max}$. The final expression is not closed form but it does indicate that resistive measurements can be derived from the difference in amplitudes, $B_{RX}(\omega_r) - B_{RX}(\omega^*)$. Once the resistance correlation to amplitude difference, $$R = f\left(\frac{B_{RX}(\omega_r) - B_{RX}(\omega^*)}{B_{RXmax}(\omega_{rmax})}\right),$$

has been characterized, this method requires only two amplitude measurements to determine resistance as compared with the multiple measurements required to determine 3 dB reduction. The same correlation can be done directly with temperature since resistance is dependent upon temperature. The amplitude difference is normalized to the resonant amplitude to have this value be independent of the interrogation antenna-sensor separation distance.

The present invention can also be used to monitor fluid level by modifying Equation (12) to include the presence of material in the sensor's magnetic field. Once again, sensor 12 is placed external to non-conductive container 100. Non-gaseous material/substance contents 102 fills the lower portion of container 100 to level x. Part of the sensor trace overlaps that portion of the container. When sensor 12 is powered via recorder 16 using Faraday induction, a current, i, is created along the trace. The responsive magnetic field, $dB_{RX}(T,x)_{contents}$, along any part of the trace of length, $d\ell_i$, that is exposed to the wall of container 100 and contents 102, is $$dB_{RX}(T,x)_{contents} = \left[\frac{\mu_f}{4\pi}\right] \left[\frac{\left.\frac{d\Phi_{B_{TX}}}{dt}\right|_{i_0}}{\sqrt{S^2 + [R_{min}[1 + \alpha(T_{min} - T)]]^2}}\right] \frac{d\ell_i \sin\theta_i}{r_i^2} \quad (19)$$

where $\mu_f$ is the complex magnetic permeability of the wall of container 100 and contents 102. The other part of the magnetic field is exposed only to the wall of container 100 and air, and is $$dB_{RX}(T,x)_{container} = \left[\frac{\mu_c}{4\pi}\right] \left[\frac{\left.\frac{d\Phi_{B_{TX}}}{dt}\right|_{i_0}}{\sqrt{S^2 + [R_{min}[1 + \alpha(T_{min} - T)]]^2}}\right] \frac{d\ell_i \sin\theta_i}{r_i^2} \quad (20)$$

where $\mu_c$ is the complex magnetic permeability of the container wall and the air.

The total magnetic field produced by sensor 12 is $$B_{RX}(T,x) = \int dB_{RX}(T,x)_{fluid} \cdot d\ell_i + \int dB_{RX}(T,x)_{container} \cdot d\ell_i \quad (21)$$

The first term in Equation (21) is integrated over all elements, $d\ell_i$ of sensor 12 that overlap contents 102. The second term is integrated over the remaining elements of sensor 12 and is $$B_{RX}(T,x)_{container} = \left[\frac{1}{4\pi}\right] \left[\frac{\left.\frac{d\Phi_{B_{TX}}}{dt}\right|_{i_0}}{\sqrt{S^2 + [R_{min}[1 + \alpha(T_{min} - T)]]^2}}\right] \left[\mu_f \int \left.\frac{d\ell_i \sin\theta_i}{r_i^2}\right|_{Exposed} + \mu_c \int \left.\frac{d\ell_i \sin\theta_i}{r_i^2}\right|_{Non\text{-}exposed}\right] \quad (22)$$

The inductance is $$L = L(x) = \frac{B_{RX}(T,x)}{i}. \quad (23)$$

The response frequency from sensor 12 is dependent upon the inductance and corresponds to the level of contents 102 inside container 100 as follows $$\omega = \frac{1}{2\pi\sqrt{L(x)C}}. \quad (24)$$

Note that Equation (24) is still valid if the sensor is placed within a container as long as a portion of the sensor is placed external to the container or the antenna is placed within the container. If the container contents are electrically non-conductive and non-viscous, the sensor can be placed in the container without being encapsulated (i.e., the contents are exposed to the sensor's electric field between the sensor's conductive neighboring traces). The contents have a permeability value within the sensor's magnetic field and dielectric value within the sensor's electric field. The capacitance changes correspondingly as the electric field is exposed to the container contents. The electric field is located between the traces of sensor 12. If the sensor is exposed to non-viscous contents, the change in capacitance must also be included in the response equation in a manner similar to the development of Equations (22) and (24) so that $$\omega_n = \frac{1}{2\pi\sqrt{L(x)C(x)}} \quad (25)$$

and $$S = \left(\omega L(x) - \frac{1}{\omega C(x)}\right). \quad (26)$$

The damped natural frequency, $\omega_d$, of sensor 12 is what is interrogated by the magnetic field response recorder, When the sensor is excited with magnetic field harmonics whose frequency is that of the damped natural frequency, the sensor magnetic field response will be at its maximum amplitude. The damped natural frequency is dependent upon resistance of the sensor and is $$\omega_d = \sqrt{\omega_n^2 - \frac{1}{2}\left(\frac{R}{L(x)}\right)^2}. \quad (27)$$

Substituting Equation (8) for R yields $$\omega_d = \sqrt{\omega_n^2 - \frac{1}{2}\left(\frac{[R_{min}[1 + \alpha(T_{min} - T)]]^2}{L(x)}\right)^2}. \quad (28)$$

Equations (22) and (28) show that sensor response amplitude, bandwidth and frequency are dependent upon the contents' level and temperature. Combinations of measured frequency and amplitude (bandwidth) can be correlated to combinations of contents' level and temperature allowing the sensor to be used to concurrently measure both quantities. That is, by knowing either the response frequency and amplitude or the response frequency and bandwidth, one knows the corresponding temperature and contents level.

At any fluid level, the highest frequency and response amplitude (smallest bandwidth) occur at $T_{min}$, and are respectively written as $$\omega_d = \sqrt{\omega_n^2 - \frac{1}{2}\left(\frac{R_{min}}{L(x)}\right)^2} \quad (29)$$

and $$B_{RX}(T,x)_{container} = \left[\frac{1}{4\pi}\right]\left[\frac{\left.\frac{d\Phi_{B_{TX}}}{dt}\right|_{i_0}}{\sqrt{S^2 + R_{min}^2}}\right]\left[\mu_f \int \left.\frac{dl_i \sin\theta_i}{r_i^2}\right|_{Exposed} + \mu_c \int \left.\frac{dl_i \sin\theta_i}{r_i^2}\right|_{Non\text{-}exposed}\right]. \quad (30)$$

As the temperature increases, the damped natural frequency and response amplitude decrease, while the bandwidth increases. Equations (22) and (28) are both dependent upon temperature and container contents level.

If the contents of the container are not emptied/ejected with time but experience a physical change (e.g., biological decay such as when food ages, chemical change such as occurs with car battery fluid, material phase transformation, etc.), the physical behavior of the sensor described in Equations (22) and (28) can be used to monitor those changes within a non-conductive container. The material magnetic permeability, $\mu_f(t)$, changes with time. As a result, the response amplitude, $B_{RX}(T,x)_{container}$, and damped natural frequency, $\omega_d$, also change with time in accordance with the following respective relationships $$B_{RX}(T,x)_{container} = \left[\frac{1}{4\pi}\right] \quad (31)$$

$$\left[\frac{\left.\frac{d\Phi_{B_{TX}}}{dt}\right|_{i_0}}{\sqrt{S^2 + [R_{min}[1+\alpha(T_{min}-T)]]^2}}\right]\left[\mu_f(t) \int \left.\frac{dl_i \sin\theta_i}{r_i^2}\right|_{Exposed} + \mu_c \int \left.\frac{dl_i \sin\theta_i}{r_i^2}\right|_{Non\text{-}exposed}\right].$$

and $$\omega_d = \sqrt{\omega_n^2 - \frac{1}{2}\left(\frac{[R_{min}[1+\alpha(T_{min}-T)]]}{L(x)}\right)^2}. \quad (32)$$

The material dielectric value also changes with time and affects the response frequency, amplitude and bandwidth if the material is exposed to the sensor's electric field as is the case if the sensor is not encased and is directly exposed to the material.

The advantages of the present invention are numerous. A variety of attributes of a non-gaseous substance/material can be monitored concurrently without placing any device in a container that houses the substance/material. The sensor and housing portions of the present invention are simple and inexpensive to manufacture. Further, the sensor and housing are readily adapted to work with a variety of types of containers. Existing containers need not be modified as a sensor and housing can simply be placed adjacent to the container where "adjacent" includes attachment of the sensor's housing to the container. The wireless activation and reading of the sensor eliminates the need for any special wiring and wire dressing.

If the sensor is broken, punctured or torn such that some of the trace portions are severed from the electrically conductive geometric pattern, the single sensor will result in one or more concentric inductively coupled sensors, as long as the remaining trace portions can hold an electric field and a magnetic field. A detailed discussion of the manner in which the sensor can be damaged and continue in use is disclosed in co-pending U.S. patent application Ser. No. 11/864,012, filed Sep. 28, 2007, the contents of which are hereby incorporated by reference. If the sensor can hold a magnetic field after damage, it can be automatically recalibrated for use using co-pending U.S. patent application Ser. No. 11/930,222, filed Oct. 31, 2007, the contents of which are hereby incorporated by reference.

Figure 11A:
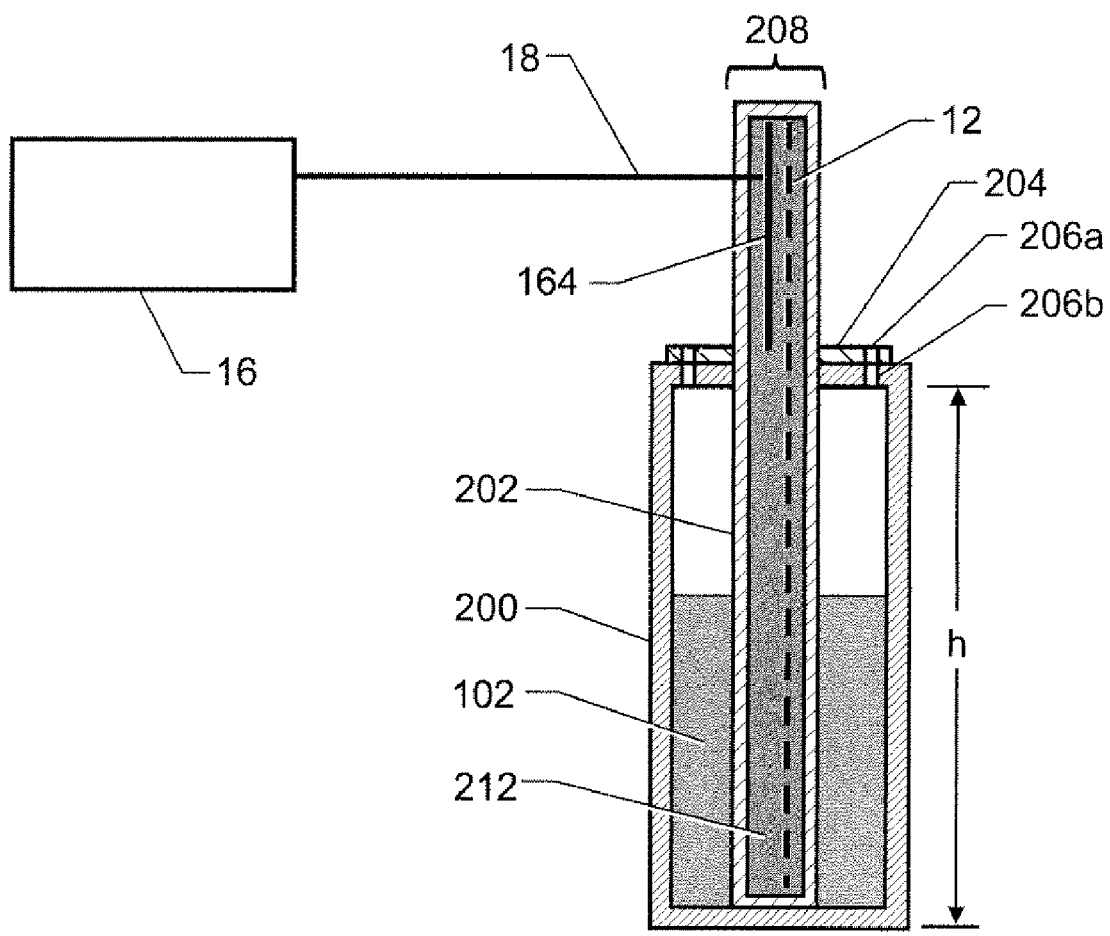
FIGS. 11a and 11b are side and top schematic views, respectively, of a sensing system that can be used to monitor various attributes of the contents of an electrically conductive container in accordance with an embodiment of the present invention.
Figure 11B:
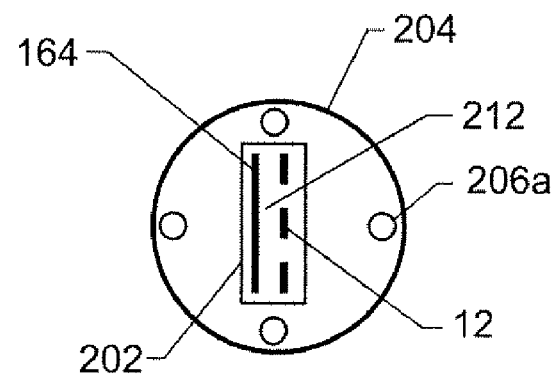

In some applications, it may be desirable to use the sensor described herein to monitor one or more of level, temperature, magnetic permeability and electrical dielectric constant of a non-gaseous material in an electrically conductive container. Several embodiments of the present invention for monitoring a non-gaseous material in an electrically conductive container are shown in FIGS. 11 and 12. These embodiments can be used as either a new or replacement fluid measurement system that can take the analog output from the magnetic field response recorder 16 and direct it to an existing gage. The side and top views of a first embodiment are shown in FIGS. 11a and 11b. Sensor 12, used for sensing the attributes of the contents 102 of electrically conductive container 200, extends beyond the height h. The sensor 12 can either be encapsulated in a housing 202 made of electrically non-conductive material or embedded in a non-conductive material. The material of housing 202 and the embedding material must be chemically and thermally resilient to the environment to which the sensor 12 is anticipated to be exposed, and electrically non-conductive. A mounting flange 204, mechanically coupled to housing 202, is used to secure, such as by fasteners (e.g., threaded screws) through holes 206a mechanically connected to container 200 using threaded holes 206b or other appropriate means, the sensor/antenna assembly 208 to container 200. The antenna 164 can be placed within the housing 202, but, to prevent any direct current from entering the container 200, it should not extend below the flange 204. When a housing 202 is used, a means 212 should be used to maintain a constant spacing between the antenna 164 and the sensor 12 to maintain the position of the antenna 164 with respect to the sensor 12 and the sensor position with respect to the housing wall. Such means can include the housing material. The antenna 164 is directly connected to magnetic field response recorder 16 via hard wire connection 18. As discussed earlier, if the container contents 102 are electrically non-conductive and non-viscous, sensor 12 can be placed in the container 200 without being encapsulated (i.e., the contents are also exposed to the sensor's electric field between the sensor's conductive neighboring traces).

Figure 12A:
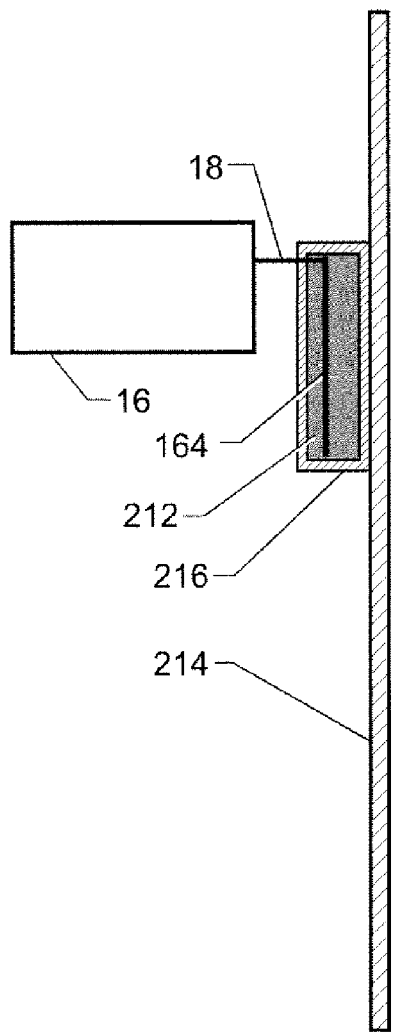
FIGS. 12a, 12b and 12c illustrate a further embodiment of a sensing system that can be used to monitor various attributes of the contents of an electrically conductive container.
Figure 12B:
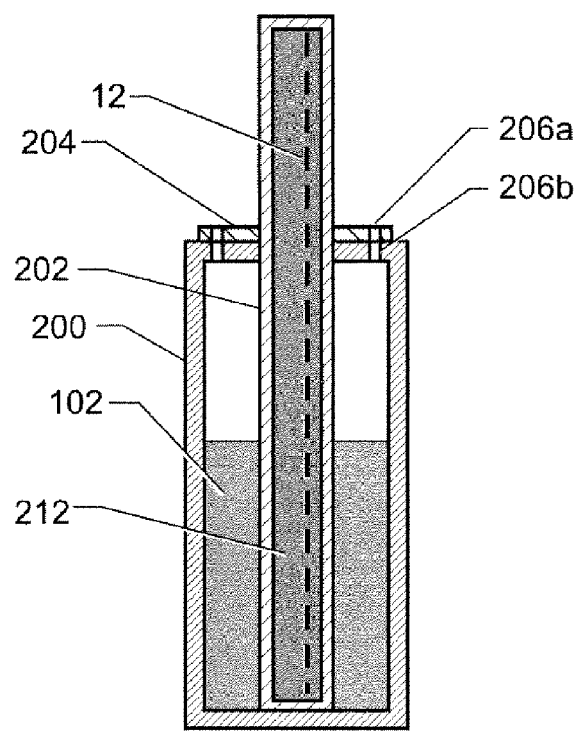
Figure 12C:
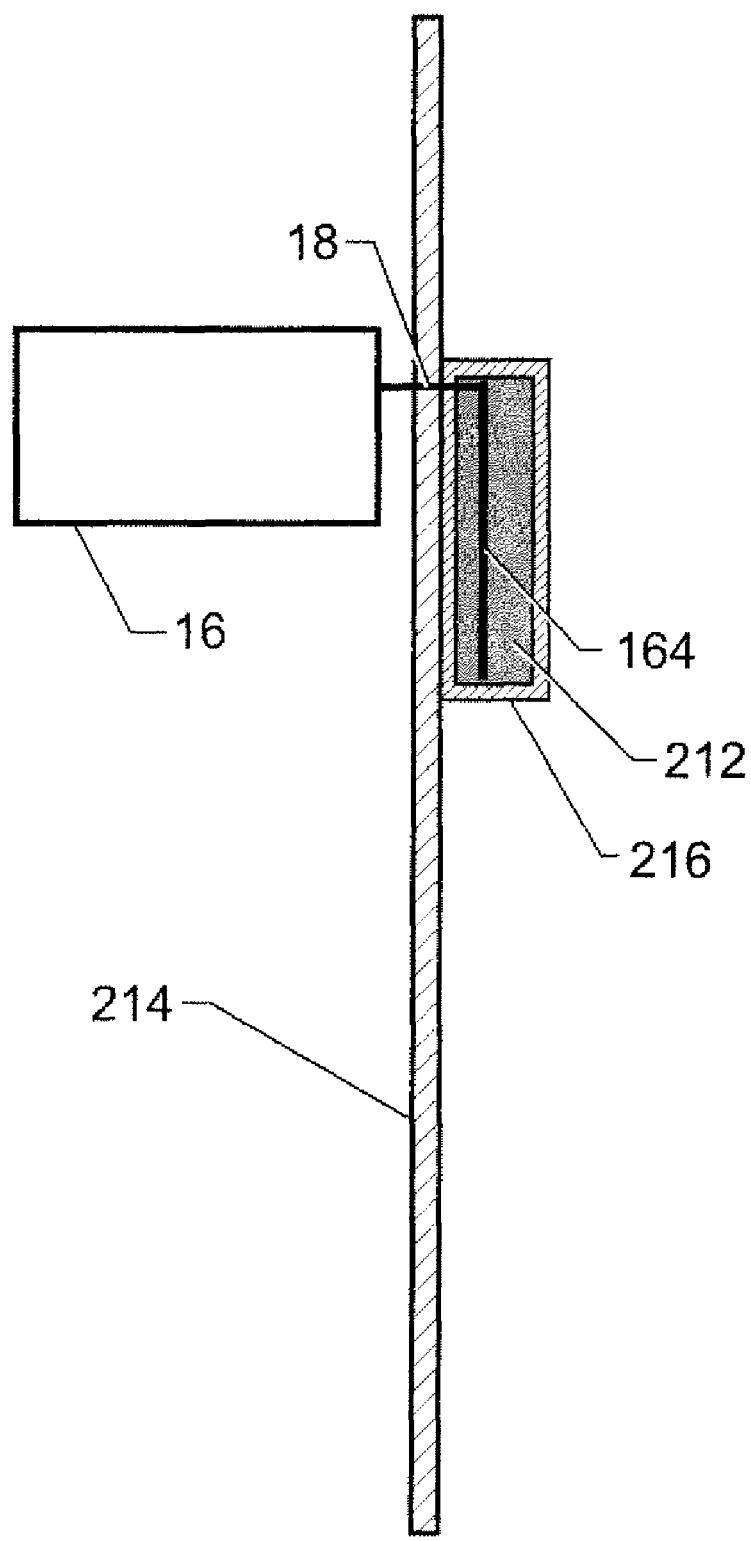

In a further embodiment, shown in FIG. 12, antenna 164 is placed outside the sensor housing 202. This embodiment can be used as either a new or replacement fluid measurement system that can take the analog output from the magnetic field response recorder 16 and direct it to an existing gage. When this embodiment is used, the antenna 164 from the magnetic field response recorder 16 can be placed outboard of a bulkhead or vapor barrier 214, as shown in FIG. 12a or attached to a bulkhead/vapor barrier 214 between the sensor 12 and the bulkhead/vapor barrier 214, as shown in FIG. 12c. A bulkhead/vapor barrier as just described can also be used with the embodiments shown in FIG. 1.

Figure 13:
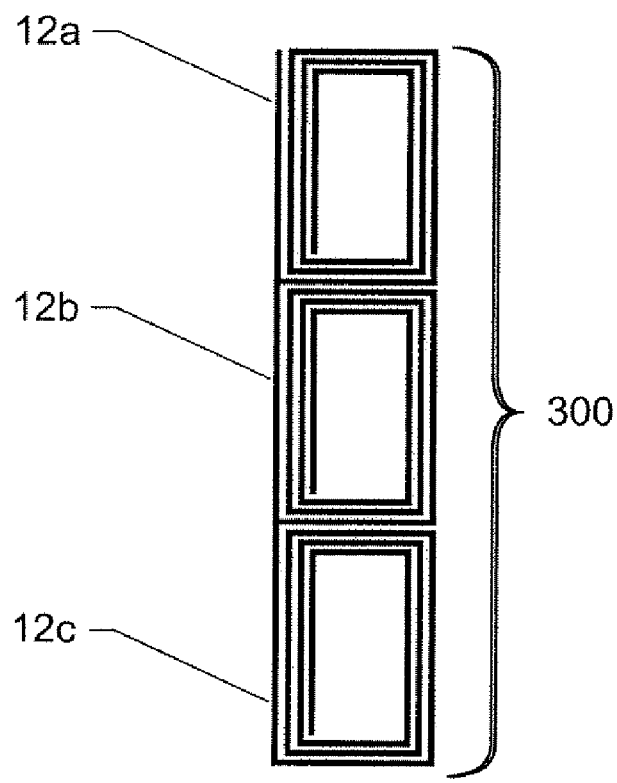
FIG. 13 illustrates an array of inductively coupled sensors.
Figure 14:
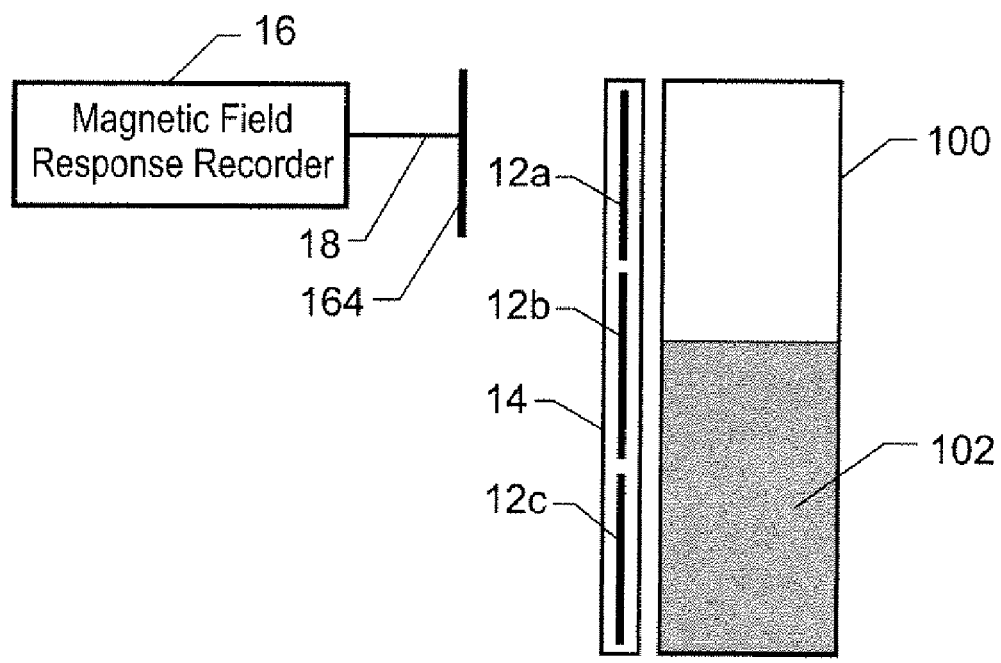
FIG. 14 illustrates an array of three inductively coupled sensors encased in an electrically non-conductive material with the upper sensor being directly powered and interrogated.

The invention has been described as a single sensor, but the geometric patterns 12 can be used in tandem for non-invasive sensing the contents of a container using the sensing and interrogation technique described in co-pending U.S. patent application Ser. No. 11/671,089, filed Feb. 5, 2007, the contents of which are hereby incorporated by reference. FIG. 13 illustrates an array 300 of three sensors 12*a-c*. FIG. 14 illustrates three sensors 12*a-c* encased in housing 14 powered and interrogated using magnetic field response recorder 16. Antenna 164 is placed in front of sensor 12*a* to power and interrogate sensors 12*a-c* via inductively coupling. Each sensor can be used to measure or monitor the physical properties of the contents 102 of container 100.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A wireless sensing system for simultaneously monitoring one or more of level, temperature, magnetic permeability and electrical dielectric constant of a non-gaseous material in an electrically non-conductive container, said system comprising:
   an environmentally-sealed housing that is electrically non-conductive, said housing adapted to be positioned adjacent to an electrically non-conductive container that stores a non-gaseous material having electrical dielectric and magnetic permeability properties, said housing spanning a selected height of the container;
   an electrical conductor having first and second ends and shaped to form a two-dimensional geometric pattern between said first and second ends, said conductor in said geometric pattern and portions thereof defining an open-circuit that can store and transfer electrical and magnetic energy, said conductor resonating in the presence of a time-varying magnetic field to generate a harmonic response, said conductor mounted in said housing such that said geometric pattern substantially spans said selected height of the container; and
   a magnetic field response recorder for wirelessly transmitting said time-varying magnetic field to power said conductor and for wirelessly detecting said harmonic response that is an indication of at least one of level of the material in the container, temperature of the material in the container, magnetic permeability of the material in the container, and dielectric constant of the material in the container.

2. A wireless sensing system as in claim 1 wherein said conductor comprises a thin-film trace defining said geometric pattern.

3. A wireless sensing system as in claim 2 wherein the width of said trace is non-uniform.

4. A wireless sensing system as in claim 2 wherein the spacing between adjacent portions of said trace is non-uniform.

5. A wireless sensing system as in claim 1 wherein said geometric pattern is a spiral.

6. A wireless sensing system as in claim 1 wherein said magnetic field response recorder includes a transceiving antenna mounted in said housing and spaced apart from said conductor so-shaped in said geometric pattern.

7. A wireless sensing system as in claim 6, further comprising a vapor barrier between said antenna and said container.

8. A wireless sensing system for simultaneously monitoring one or more of level, temperature, magnetic permeability and electrical dielectric constant of a non-gaseous material in an electrically non-conductive container, said system comprising:
   an environmentally-sealed housing that is electrically non-conductive, said housing adapted to be positioned adjacent to an electrically non-conductive container that stores a non-gaseous material having magnetic permeability and electrical dielectric properties, said housing defining a chamber spanning a selected height of the container;
   an electrical conductor having first and second ends and shaped to form a two-dimensional geometric pattern between said first and second ends, said conductor in said geometric pattern and portions thereof defining an open-circuit that can store and transfer electrical and magnetic energy, said conductor resonating in the presence of a time-varying magnetic field to generate a harmonic response, said conductor mounted in said chamber such that said geometric pattern substantially spans said selected height of the container at a fixed distance from the container and in a fixed orientation with respect to the container; and
   a magnetic field response recorder for wirelessly transmitting said time-varying magnetic field to power said conductor and for wirelessly detecting said harmonic response that is an indication of at least one of level of the material in the container, temperature of the material in the container, magnetic permeability of the material in the container, and dielectric constant of the material in the container.

9. A wireless sensing system as in claim 8 wherein said conductor comprises a thin-film trace defining said geometric pattern.

10. A wireless sensing system as in claim 9 wherein the width of said trace is non-uniform.

11. A wireless sensing system as in claim 9 wherein the spacing between adjacent portions of said trace is non-uniform.

12. A wireless sensing system as in claim 8 wherein said geometric pattern is a spiral.

13. A wireless sensing system as in claim 8 wherein said magnetic field response recorder includes a transceiving antenna mounted in said housing and spaced apart from said conductor so-shaped in said geometric pattern.

14. A wireless sensing system as in claim 13, further comprising a vapor barrier between said antenna and said container.

15. A wireless sensing system for simultaneously monitoring one or more of level, temperature, magnetic permeability and electrical dielectric constant of a non-gaseous material in an electrically conductive container, said system comprising:
   an environmentally-sealed housing that is electrically non-conductive, said housing adapted to be partially positioned in said electrically conductive container that stores a non-gaseous material having electrical dielectric and magnetic permeability properties, said housing spanning the height of said container and extending for a selected distance beyond said container height;
   an electrical conductor having first and second ends and shaped to form two-dimensional geometric pattern between said first and second ends, said conductor in said geometric pattern and portions thereof defining an open-circuit that can store and transfer electrical and magnetic energy, said conductor resonating in the presence of a time-varying magnetic field to generate a harmonic response, said conductor mounted in said housing such that said geometric pattern substantially spans said height of said housing; and a magnetic field response recorder for wirelessly transmitting said time-varying magnetic field to power said conductor and for wirelessly detecting said harmonic response that is an indication of at least one of level of the material in said container, temperature of the material in the container, magnetic permeability of the material in the container, and dielectric constant of the material in the container.

16. A wireless sensing system as in claim 15 wherein said conductor comprises a thin-film trace defining said geometric pattern.

17. A wireless sensing system as in claim 16 wherein the width of said trace is non-uniform.

18. A wireless sensing system as in claim 16 wherein the spacing between adjacent portions of said trace is non-uniform.

19. A wireless sensing system as in claim 15 wherein said geometric pattern is a spiral.

20. A wireless sensing system as in claim 15 wherein said magnetic field response recorder includes a transceiving antenna mounted in said housing and spaced apart from said conductor so-shaped in said geometric pattern.

21. A wireless sensing system as in claim 15 wherein said magnetic field response recorder includes a transceiving antenna mounted apart from said housing and from said conductor so-shaped in said geometric pattern.

22. A wireless sensing system as in claim 21, further comprising a vapor barrier between said antenna and said container.

23. A wireless sensing system as in claim 21 wherein said antenna is positioned between a vapor barrier and said container.

* * * * *